Dec. 1, 1970 E. KOOI 3,544,861

STABILIZED SEMICONDUCTOR DEVICE

Filed Sept. 3, 1968 3 Sheets-Sheet 1

INVENTOR.

ELSE KOOI

BY

AGENT

INVENTOR.
ELSE KOOI
BY
Frank R. Trifari
AGENT

Dec. 1, 1970 E. KOOI 3,544,861

STABILIZED SEMICONDUCTOR DEVICE

Filed Sept. 3, 1968 3 Sheets-Sheet 3

INVENTOR.

ELSE KOOI

BY

AGENT 3,544,861
STABILIZED SEMICONDUCTOR DEVICE

Else Kooi, Emmasingel, Eindhoven, Netherlands, assignor, by mesne assignments, to U.S. Philips Corporation, New York, N.Y., a corporation of Delaware Filed Sept. 3, 1968, Ser. No. 756,803
Claims priority, application Netherlands, Sept. 12, 1967, 6712435
Int. Cl. H01l 5/02
U.S. Cl. 317—235 10 Claims

ABSTRACT OF THE DISCLOSURE

A stabilized semiconductor device is described employing a field relief interrupted ring which surrounds an interconnection to an active region of the device. At the area of the interruption, a guard ring or channel interrupter is provided in the semiconductor surface, and the field relief ring is connected to the channel interrupter. This arrests any inversion layers that may form in the surface before or during operation of the device.

Figure 1:
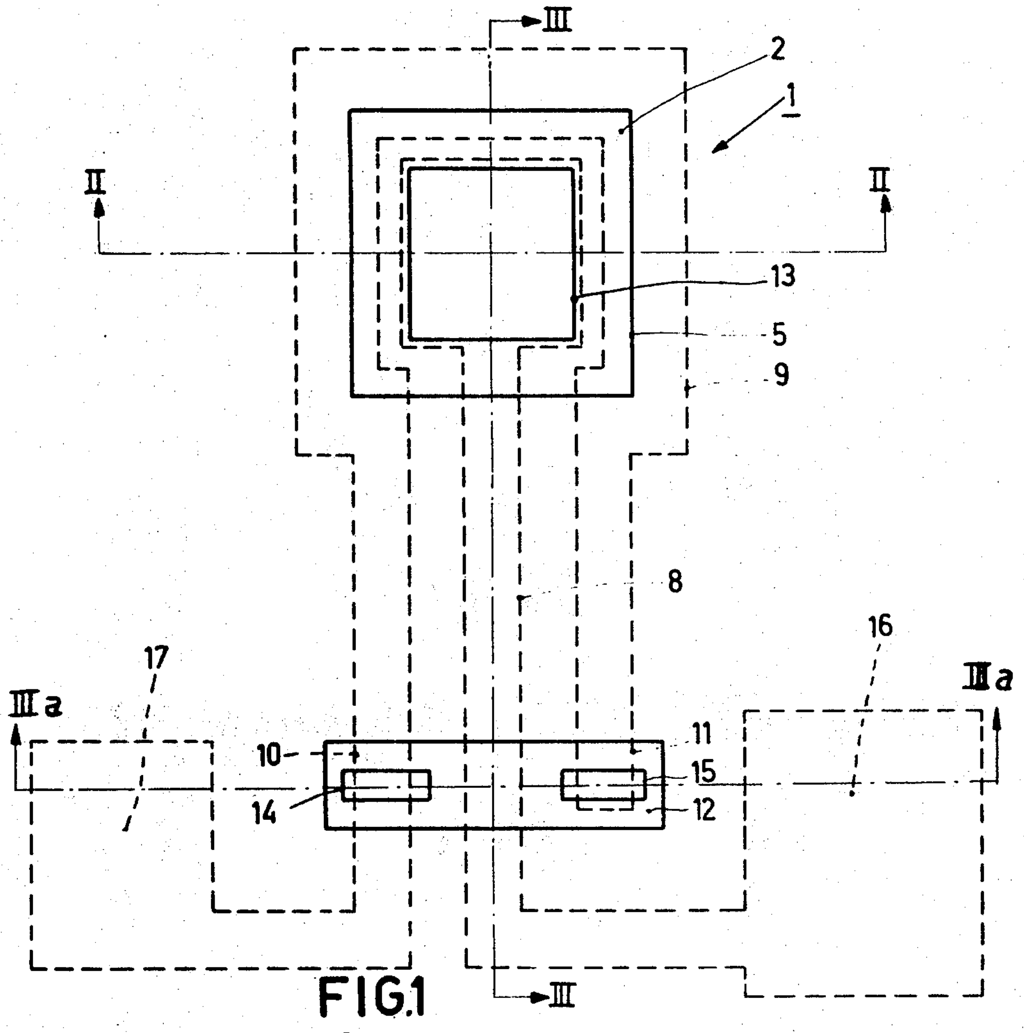

The invention relates to a semiconductor device comprising a semiconductor body having a first region of one conductivity type and a second region of the opposite conductivity type which is completely surrounded by the first region and constitutes a pn-junction with said region, said junction intersecting a flat surface of the body according to a closed curve, the said surface being covered, at least at the area of the closed curve, with an insulating layer below which an inversion channel may be formed.

Semiconductor devices of the type described are known in semiconductor technology by the name of planar structures and are frequently used both in the form of discrete components and in the form of integrated circuits.

In such devices the problem presents itself that in or on the insulating layer, or at the boundary surface between the insulating layer and the semiconductor body, charges may be present or be formed which moreover can move under the influence of electric fields. Such a charge is hereinafter briefly referred to as surface charge.

As a result of the presence of such surface charges an inversion layer may be formed on the semiconductor surface located below the insulating layer and having a conductivity type opposite to that of the underlying semiconductor body. Such inversion layers may already be present without external voltages having been applied to the device as a result of permanently present surface charges. Alternatively an inversion layer may be induced by an applied electric field, for example, due to charge displacement over an oxide layer which is located above a pn-junction polarized in the reverse direction. Such an inversion layer may give rise to an increase of the effective surface area of the pn-junction so that a capacitance increase occurs which is undersirable particularly in integrated circuits for high frequencies.

For removing or reducing the above-described disadvantageous influence of the above-mentioned surface charges or displacements thereof, various methods have been suggested. According to a first known method an annular metal layer is provided over the insulating layer at the area of the pn-junction and is connected to a reference potential for which purpose it is in practice usually connected electrically to one of the semiconductor regions located on either side of the pn-junction, as a result of which the potential at the regions of the insulating layer covered by the metal layer is stabilized. Such a metal ring usually is referred to as a field relief ring. This method has the drawback that the metal ring, in order to be as effective as possible, must be fully closed, so that if a metal track is present which extends over the insulating layer and has to connect a semiconductor region located inside the ring to a contact place located outside the ring, said metal track has to be insulated from the ring, for example, by silicon oxide provided pyrolythically on the metal ring.

According to a second known method, a guard ring is provided around and at a distance from the pn-junction, which ring is in the form of a surface region having the same conductivity type as the underlying semiconductor body but a higher charge carrier concentration, for example, a diffused surface region or a surface region formed by induction. The concentration of charge carriers in said guard ring is so high that an inversion layer of the type described cannot be formed herein so that an inversion layer formed on either side of the guard ring is interrupted. However, it is not possible to provide said guard ring very closely to the pn-junction since in this case a very low breakdown voltage could occur between the second region and the guard ring. Providing such a guard ring, therefore, consumes space which may be a drawback particularly in integrated circuits. Furthermore, the only result of such a guard ring is the interruption of an inversion channel without the inversion channel itself being stabilized.

The object of the invention is to provide a construction in which the difficulties occuring in the described known construction are avoided or are at least mitigated considerably. Therefore, according to the invention, a semiconductor device of the type mentioned in the preamble is characterized in that a first metal layer is provided which extends on the insulating layer above the first and the second regions and that a second metal layer referred to as a stabilisation ring separated from the first metal layer is provided and extends on the insulating layer at least above the first region and comprises means for applying to said layer a potential to restrict an inversion channel below the layer, which second metal layer surrounds a considerable part of the second region and is interrupted at the area of the first metal layer, in which above the first region at the area of the interruption on either side of the first metal layer parts of the second metal layer are located above one same surface region which is separated from the second region and serves to interrupt an inversion channel formed below the insulating layer.

The construction according to the invention enables inter alia a contacting of the region located inside the second metal layer and serving as a stabilisation ring without the interposition of any further insulation layers. Alternatively the stabilisation ring may be provided closely to or above the pn-junction, so that a saving of space which often is highly desirable is obtained relative to the described known guard ring. Furthermore, stabilisation of the inversion layer is obtained below the whole surface of the second metal layer.

The first metal layer may be located entirely on the insulating layer inside the surface surrounded by the second metal layer. However, according to an important preferred embodiment, the first metal layer adjoins the second region through an aperture in the insulating layer or adjoins a further surface region located within the second region.

As was already noted, surface regions to interrupt an inversion channel are known inter alia by the name of "guard ring" or "channel stopper" and can be formed, for example, in a simple manner by diffused regions of the same conductivity type as the underlying semiconductor region but with a stronger doping.

The second metal layer or stabilisation ring may be located with its extremities above the channel-interrupting region without contacting the same and may be connected, through a metal track or another connection conductor, to a suitably chosen potential, for example, to the first region of one conductivity type. However, according to a preferred embodiment of the invention, the second metal layer adjoins the channel-interrupting surface region at the area of the interruption through at least one aperture in the insulating layer so that in general also good ohmic contact with the first region is obtained which is of particular importance when the first region is doped comparatively weakly.

The second metal layer may advantageously be provided so that it extends over at least a considerable part of the intersecting curve of the pn-junction and the surface. In this case the potential is stabilized up to the pn-junction so that no channel formation can occur by induction and leakage currents are restricted to a minimum. This construction will be preferred in those cases in which a cut-off voltage is applied across the pn-junction between the first and the second region, which voltage is considerably below the breakdown voltage, and in which a minimum leakage current is imposed as the principal requirement. In cases in which the highest possible breakdown voltage of the pn-junction is desirable it may be preferred, however, to provide the second metal layer only above the first region at a distance from the line of interesction of the pn-junction and the surface. In fact, when the stabilisation ring connected to the first region extends till on or across the pn-junction, a field concentration may occur by the potential of the stabilisation ring at the surface, so that the breakdown voltage of the pn-junction is reduced. Although an inversion channel may be present or be formed between the pn-junction and the stabilisation ring by providing the stabilisation ring on the first region at some distance from the pn-junction, this is interrupted below the ring or is at least guarded from further intensification by induction which in many cases is sufficient.

The insulating layer may consist of various materials, for example, glass or oxide, for example, titanium oxide, and so on. However, insulating layers are advantageously used which consist at least partly of oxides or nitrides of silicon.

The invention furthermore relates to a circuit arrangement in which a blocking voltage is applied across the pn-junction between the first and the second region.

Figure 2:
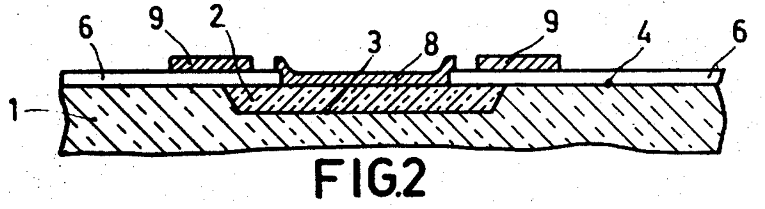

In order that the invention may be readily carried into effect a, few examples thereof will now be described in greater detail, by way of example, with reference to the accompanying drawings, in which FIG. 1 is a diagrammatic plan view of a semiconductor device according to the invention, FIG. 2 is a diagrammatic cross-sectional view taken on the line II—II of the device shown in FIG. 1.

Figure 3:
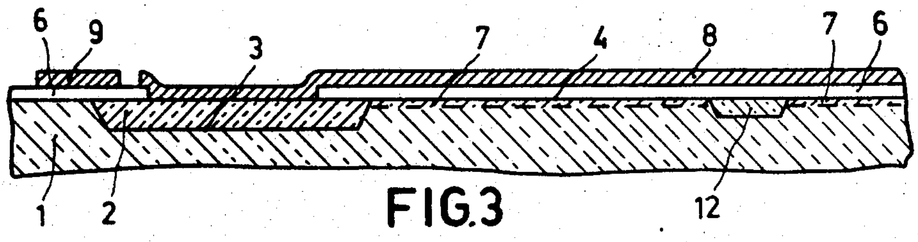
Figure 3A:
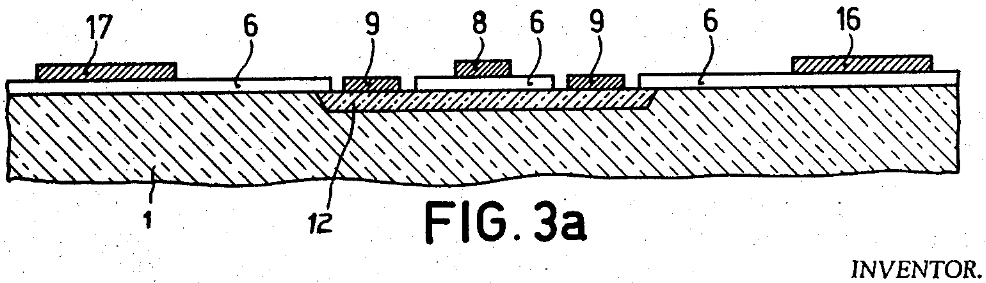

FIGS. 3 and 3*a* are a diagrammatic cross-sectional views of the device shown in FIG. 1, taken on the line III—III and the line III*a*—III*a*, respectively.

Figure 4:
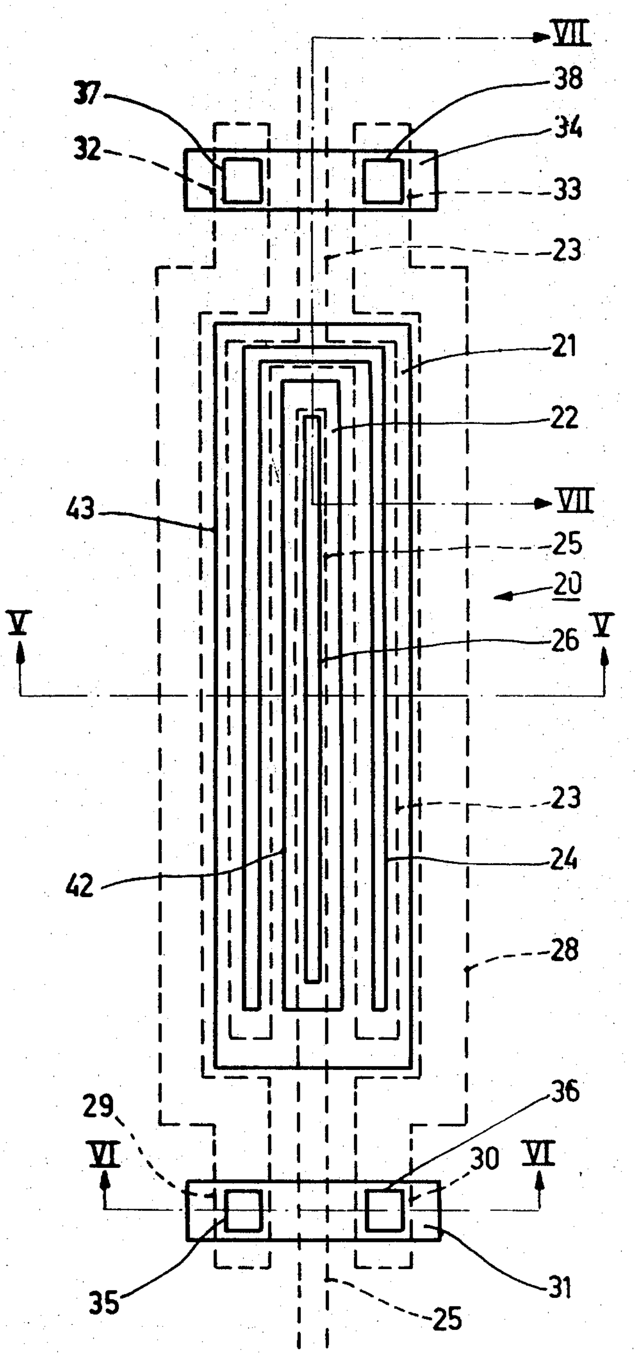
Figure 5:
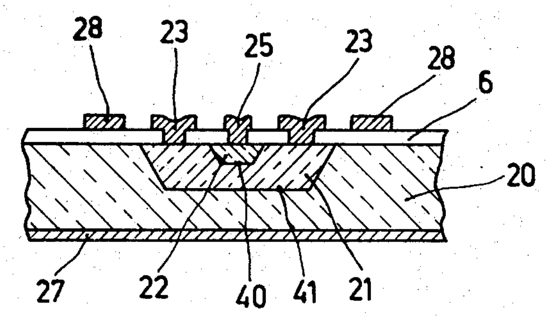
Figure 6:
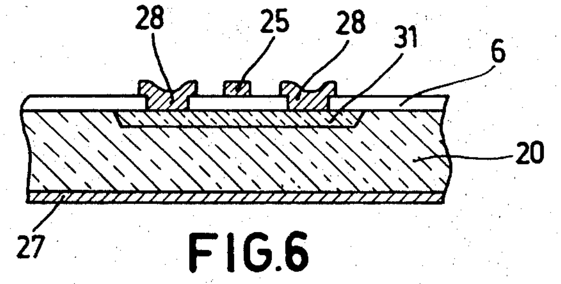
Figure 7:
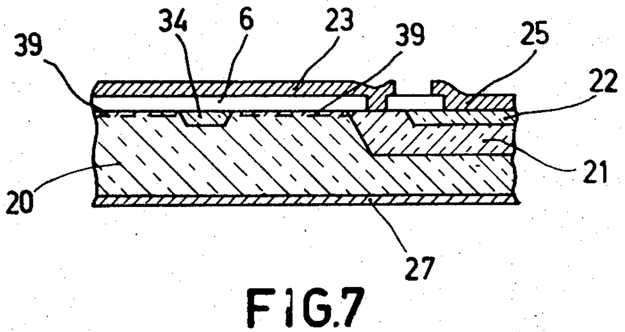

FIG. 4 is a diagrammatic plan view of another semiconductor device according to the invention, and FIGS. 5, 6 and 7 are diagrammatic cross-sectional views of the device shown in FIG. 4, taken on the lines V—V, VI—VI and VII—VII.

For clearness' sake, the figures are not drawn to scale and the dimensions of the thickness notably are exaggerated. Corresponding components are referred to by the same reference numerals. In the plan views metal layers are shown in broken lines.

A semiconductor device according to the invention is shown in plan view in FIG. 1, and in a cross-sectional view in FIGS. 2, 3 and 3*a* taken on the lines II—II, III*a*—III*a*, respectively. The device comprises a diode and consists of a semiconductor body of silicon, comprising a first region 1 of n-type silicon having a resistivity of 5 ohm. cm. and a second diffused region 2 of p-type silicon which is surrounded entirely by the first region and constitutes a pn-junction 3 therewith, which intersects a flat surface 4 of the body according to a closed curve 5 (see FIG. 1). At the area of the closed curve 5 the surface 4 is covered with an insulating layer 6 of silicon oxide, below which insulating layer 6 an inversion channel 7 (see FIG. 3) may be formed, for example, under the influence of a cut-off voltage applied across the pn-junction (3, 5).

According to the invention, a first metal layer 8 of aluminum is provided which extends on the oxide layer above the regions 1 and 2, while a second aluminum layer 9 separated from the layer 8 is provided which extends on the oxide layer 6 above the regions 1 and 2 over a considerable part of the curve of intersection 5 and surrounds a considerable inner region 2. At the area of the metal layer 8, the metal layer 9 is interrupted. Above the region 1, at the area of the interruption, the parts 10 and 11 of the layer 9 are located above a diffused n-type conductive region 12 (see FIGS. 1 and 3) which interrupts the inversion channel 7 (see FIG. 3*a*) and is doped more strongly than the n-type conductive region 1.

The first metal layer 8 adjoins the region 2 through a contact window 13 in the oxide layer 6 and is connected to a contact layer or pad 16 while the second metal layer 9 adjoins the diffused region 12 at the area of the interruption through apertures 14 and 15 in the oxide layer and is connected to a contact layer or pad 17. A voltage can be set up across the pn-junction 3 through the contact layers 16 and 17.

The dimensions of the region 2 are approximately 25 x 25 μm. The distance from the region 12 to the region 2 is approximately 30 μm. and is comparatively large in order to prevent the breakdown voltage of the junction (3, 5) from becoming too low. The stabilisation ring constituted by the metal layer 9, however, may be provided in the immediate proximity of the region 2, so that a considerably smaller space is required than would be necessary when the region 12 would completely surround the region 2. Since the stabilisation ring 9 is furthermore connected to the region 1, through the region 12, no inversion channel can be formed below the ring 9 by induction when a cut-off voltage is set up across the pn-junction 3, while an inversion channel possibly present already below the layer 9 cannot be intensified by induction as a result of the stabilisation of the potential on the oxide layer produced by the layer 9.

The device shown in FIGS. 1 to 3 may be manufactured by using masking and diffusion methods commonly used in semiconductor technology. The starting material is an n-type silicon disc having a resistivity of 5 ohm. cm. By thermal oxidation at 1200° C. in moist oxygen this disc is provided with an oxide layer in which subsequently a window is etched of approximately 20 x 20 μm. by using known photoresist methods. Boron is selectively diffused through the said window in a conventional manner up to a depth of approximately 3 μm., thus forming the region 2. A window of approximately 10 x 25 μm. is then etched in the oxide layer, through which window phosphorus is selectively diffused up to a depth of approximately 3 μm., thus forming the region 12. By continued thermal oxidation the minimum thickness of the oxide layer is then brought at 0.3 μm. so as to ensure a good insulation between the metal layers and the semiconductor surface. Contact windows 13, 14 and 15 are then etched in the oxide layer after which an aluminum layer, 0.5 μm. thickness, is vapour-deposited throughout the surface, which layer is then etched to the desired pattern, the layers 8 and 9 being formed.

The plan view of FIG. 4 and the cross-sectional view taken on the lines V—V, VI—VI and VII—VII of FIGS. 5, 6 and 7 show another semiconductor device according to the invention. This semiconductor device comprises a silicon transistor for high frequency having an n-type collector region 20, a diffused n-type base region 21, and a diffused n-type emitter region 22. The emitter-base juntcion 40 and the collector-base junction 41 (see FIG. 5) intersect the surface according to closed curves 42 and 43 (see FIG. 4). The surface is coated with an oxide layer as in the preceding example. The aluminum layer 23 is connected to the base region 21 through the contact window 24 in the oxide layer; the aluminum layer 25 is connected through the contact window 26 to the emitter region 22 located inside the base region 21. The collector region is contacted on the lower side of the silicon plate by means of a metal layer 27.

According to the invention, an aluminum layer 28 separated from the layers 23 and 25 is provided on the oxide layer 6 and extends on the oxide layer above the n-type collector region 20 and surrounds a considerable part of the base region 21. Both at the area of the metal layer 23 and at the area of the metal layer 25, the metal layer 28 is interrupted. In these interruptions above the collector region 22 on either side of the metal layer 23, the parts 32 and 33 of the layer 28 are located above the diffused n-type surface region 34, while on either side of the metal layer 25, the parts 29 and 30 of the layer 28 are located above the diffused n-type surface region 31. The metal layer 28 is connected to the regions 31 and 34 through the contact windows 35, 36, 37 and 38.

The regions 31 and 34 serve to interrupt any inversion channel 39 formed on the collector region 20 as a result of the above mentioned surface charges. See FIG. 7 in which the part of the channel 39 on either side of the region 34 is shown.

In a manner analogous to that of the preceding example, the combination of the regions 31 and 34 with the stabilization ring 28 serves to interrupt an inversion channel 39 and to prevent the formation or further intensification thereof, respectively. In the transistor described here the stabilization ring 28 is only provided on the collector region 20, at some distance from the curve of intersection of the collector-base region with the surface, so that, as described above, a reduction of the admissible collector-base voltage is prevented or at least essentially reduced.

The dimensions of the emitter region are approximately 15 x 100 $\mu$m., those of the base region 45 x 120 $\mu$m. The aluminum layers 23 and 25 at the area of the cross-section V—V have a width of 8–10 $\mu$m., the aluminum layer 28 of approximately 15 $\mu$m. The regions 31 and 34 have dimensions of approximately 10 x 50 $\mu$m. and are approximately 30 $\mu$m. remote from the collector-base junction while the aluminum layer 28 is approximately 5 $\mu$m. remote from this junction.

The device shown in FIGS. 4 to 7 may be manufactured by means of conventional methods. Starting material is an n-type silicon plate having a resistivity of 5 ohm. cm. This is oxidized at 1200° in moist oxygen for approximately 50 minutes, an oxide layer of approximately 0.6 $\mu$m. thickness being formed. After etching a window of approximately 40x115 $\mu$m. boron is diffused through said window starting from $B_2O_3$ (vapour deposition at 885° in dry nitrogen for 15 minutes, then difused at 1200°, 30 minutes in dry oxygen, and 30 minutes in moist oxygen). The base region 21 is obtained; the depth of penetration of the boron is approximately 3 $\mu$m. Windows are then etched in the resulting oxide film at the area of the regions 31 and 34 and of the emitter region 2 to be formed. Through these windows phosphorus is diffused at 1095° starting from $P_2O_5$ for approximately 20 minutes. The regions 31, 34 and 22 are formed; the depth of penetration of the emitter region 22 is approximately 2.3 $\mu$m. By continued thermal oxidation the thickness of the oxide film is increased to form a readily insulating layer on the regions 31 and 34, after which the contact windows 24, 26 and 35 to 38 are etched. An aluminum layer of 0.5 $\mu$m. thickness, is then vapour-deposited over the assembly from which the layers 23, 25 and 28 are formed by etching methods known per se.

It will be obvious that the invention is not restricted to the embodiments described but that many variations are possible without departing from the scope of this invention. For example, in circumstances the said first metal layer may be located entirely on the insulating layer, without adjoining the semiconductor body through a contact window, for example, when the said metal layer forms part of a gate electrode of a MOS-transistor, of a capacitance, and so on. Silcon nitride, titanium oxide or other insulating materials may be used as an insulating layer in addition to silicon oxide. The metal layer may consist of materials other than aluminum, for example, gold or nickel. Furthermore, the conductivity type mentioned in the examples may be replaced by the opposite type, in which n-type inversion channels may occur instead of the described p-type channels. The second metal layer or stabilisation ring may adjoin the channel interrupting surface region through a single contact window instead of through two windows, or may not at all adjoin said surface region, but may be connected elsewhere to the said first region of one conductivity type or be connected to a different region of the semiconductor body having a suitable potential. The dimensions stated in the examples furthermore are by no means limitative but may be chosen by the expert in agreement with the requirements imposed upon the device in question.

What is claimed is:

1. A stabilized semiconductor device comprising a semiconducteted body having a first region of one conductivity type and a second region of the opposite conductivity type which is completely surrounded by the first region and forms a pn-junction therewith, said junction intersecting a substantially flat surface of the body to form a closed curve, said surface being coated with an insulating layer at least in the area of the closed curve, said surface being susceptible of an inversion channel forming therein below said insulating layer, a first metal layer extending on the insulating layer above the first and second regions and a second metal layer separated from the first metal layer extending on the insulating layer at least above the first region and having means for supplying a potential to said second metal layer for restricting an inversion channel below said second metal layer, said second metal layer surrounding at least a considerable part of said second region and being interrupted at an area near the first metal layer, said semiconductor body having a surface region separated from the second region and serving to interrupt an inversion channel when formed in the surface below the insulating layer, and parts of the second metal layer being located above the first region in the area of the interruption of said second layer and on either side of the first metal layer and above the channel-interrupting body surface region.

2. A semiconductor device as claimed in claim 1 wherein the first metal layer adjoins and is connected to the second region through an aperture in the insulating layer.

3. A semiconductor device as claimed in claim 1 wherein the first metal layer adjoins a further surface region located within the second region through an aperture in the insulating layer.

4. A semiconductor device as claimed in claim 1 wherein the second metal layer adjoins and is connected to the channel-interrupting body surface region at the area of the interruption through at least one aperture in the insulating layer.

5. A device as set forth in claim 4 wherein both parts of the second metal layer are connected to the channel-interrupting surface region on opposite sides of the first metal layer.

6. A semiconductor device as claimed in claim 4 wherein the channel-interrupting surface region is a region of the said one conductivity type and is doped more strongly than the said first region.

7. A semiconductor device as claimed in claim 6 wherein the second metal layer extends over at least a considerable part of the said closed curve.

8. A semiconductor device as claimed in claim 1 wherein the second metal layer extends above the first region at a distance from the said closed curve.

9. A semiconductor device as claimed in claim 1 wherein the insulating layer consists at least partly of silicon oxide or silicon nitride.

10. A circuit arrangement, comprising a semiconductor device as claimed in claim 1 wherein means are provided for establishing a blocking voltage across the pn-junction between the first and the second region.

References Cited

UNITED STATES PATENTS

| | | | |
|---|---|---|---|
| 3,299,329 | 1/1967 | Pollock | 317—235 |
| 3,325,258 | 6/1967 | Fottler et al. | 317—235 X |
| 3,373,323 | 3/1968 | Walfroum et al. | 317—235 X |
| 3,474,304 | 10/1969 | Currin et al. | 317—234 |

JAMES D. KALLAM, Primary Examiner

U.S. Cl. X.R.

317—234

PO-1050
(5/69)

UNITED STATES PATENT OFFICE
CERTIFICATE OF CORRECTION

Patent No. 3,544,861 Dated December 1, 1970

Inventor(s) ELSE KOOI

It is certified that error appears in the above-identified patent and that said Letters Patent are hereby corrected as shown below:

Column 3, line 69, after "II-II," should read -- III-III, and --;

Column 4, line 14, after "considerable" should read -- part of the --;

line 19, "FIG. 3a" should read -- FIG. 3 --;

line 61, "at" should read -- to --;

line 73, "n-type" (second occurrence) should read -- p-type --;

line 75, "juntcion" should read -- junction --.

Column 6, line 30, "semiconducted" should read -- semiconducto

Signed and sealed this 30th day of March 1971.

(SEAL)
Attest:

EDWARD M.FLETCHER,JR.
Attesting Officer

WILLIAM E. SCHUYLER, JR.
Commissioner of Patents